United States Patent
Koduri

(10) Patent No.: US 12,040,249 B2
(45) Date of Patent: Jul. 16, 2024

(54) PACKAGES WITH SEPARATE COMMUNICATION AND HEAT DISSIPATION PATHS

(71) Applicant: TEXAS INSTRUMENTS INCORPORATED, Dallas, TX (US)

(72) Inventor: Sreenivasan Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 363 days.

(21) Appl. No.: 16/731,709

(22) Filed: Dec. 31, 2019

(65) Prior Publication Data

US 2021/0202345 A1   Jul. 1, 2021

(51) Int. Cl.
| | | |
|---|---|---|
| H01L 23/367 | (2006.01) | |
| H01L 21/48 | (2006.01) | |
| H01L 21/56 | (2006.01) | |
| H01L 23/13 | (2006.01) | |
| H01L 23/14 | (2006.01) | |
| H01L 23/31 | (2006.01) | |
| H01L 23/482 | (2006.01) | |
| H01L 23/485 | (2006.01) | |
| H01L 25/065 | (2023.01) | |
| H01L 25/16 | (2023.01) | |

(52) U.S. Cl.
CPC ...... *H01L 23/3675* (2013.01); *H01L 21/4875* (2013.01); *H01L 21/565* (2013.01); *H01L 23/13* (2013.01); *H01L 23/142* (2013.01); *H01L 23/3121* (2013.01); *H01L 23/4827* (2013.01); *H01L 23/485* (2013.01); *H01L 25/0655* (2013.01); *H01L 25/16* (2013.01)

(58) Field of Classification Search
CPC ... H01L 21/4875; H01L 21/565; H01L 23/13; H01L 23/142; H01L 23/3121; H01L 23/3675; H01L 23/4827; H01L 23/485; H01L 25/0655; H01L 25/16; H01L 21/4846; H01L 23/3677; H01L 23/3736; H01L 23/49816; H01L 24/19; H01L 24/24; H01L 24/26; H01L 24/82; H01L 25/50
USPC ........................................................ 257/712
See application file for complete search history.

(56) References Cited

U.S. PATENT DOCUMENTS

| | | | | |
|---|---|---|---|---|
| 4,994,897 | A | * | 2/1991 | Golubic ............ H01L 23/4334 257/667 |
| 10,629,786 | B2 | * | 4/2020 | Imai ................. H01L 33/50 |

(Continued)

FOREIGN PATENT DOCUMENTS

| | | | | |
|---|---|---|---|---|
| CN | 205488088 U | * | 8/2016 | ............ H01L 24/24 |
| CN | 207149555 U | * | 3/2018 | ... H01L 2924/15153 |

(Continued)

*Primary Examiner* — Cheung Lee
(74) *Attorney, Agent, or Firm* — Dawn Jos; Frank D. Cimino

(57) ABSTRACT

A package comprises a platform and at least one pedestal positioned along at least a portion of a perimeter of the platform. The platform and the at least one pedestal form a cavity. The package further comprises a die positioned in the cavity and on the platform, with the die having an active circuit facing away from the platform. The package also comprises a conductive layer coupled to the die and to a conductive terminal. The conductive terminal is positioned above the at least one pedestal, and the die and the conductive terminal are positioned in different horizontal planes.

26 Claims, 12 Drawing Sheets

(56) References Cited

U.S. PATENT DOCUMENTS

| | | | |
|---|---|---|---|
| 2015/0014838 A1* | 1/2015 | Yap | H01L 24/14 |
| | | | 257/706 |
| 2017/0207200 A1* | 7/2017 | Lin | H01L 21/561 |
| 2017/0365542 A1* | 12/2017 | Essig | H01L 24/25 |
| 2020/0176357 A1* | 6/2020 | Yu | H01L 23/10 |
| 2021/0020537 A1* | 1/2021 | Chan Arguedas | H01L 24/32 |

FOREIGN PATENT DOCUMENTS

| | | | | |
|---|---|---|---|---|
| CN | 107527889 B | * | 9/2019 | H01L 24/20 |
| JP | 3986832 B2 | * | 10/2007 | H01L 2224/48091 |
| JP | 4771608 B2 | * | 9/2011 | H01L 24/19 |
| KR | 20120083862 A | * | 7/2012 | H01L 23/66 |
| KR | 20190063219 A | * | 6/2019 | H01L 24/20 |
| KR | 20190075647 A | * | 7/2019 | H01L 24/19 |

\* cited by examiner

PACKAGES WITH SEPARATE COMMUNICATION AND HEAT DISSIPATION PATHS

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame pad. The assembly is later covered in a mold compound, such as epoxy, to protect the assembly from potentially damaging heat, physical trauma, moisture, and other deleterious factors. The finished assembly is called a semiconductor package or, more simply, a package. The leads are exposed to surfaces of the package and are used to electrically couple the packaged chip to devices outside of the chip.

However, other types of packages, such as flip-chip packages, are configured differently than described above. Flip-chip packages include a die, metallic bumps (e.g., solder bumps), and a redistribution layer (RDL) that interfaces between the die and the metallic bumps so that signals are routed appropriately between the bumps and the active circuitry formed on the die. Examples of such flip-chip packages include wafer chip scale packages (WCSPs).

SUMMARY

In some examples, a package comprises a platform and at least one pedestal positioned along at least a portion of a perimeter of the platform. The platform and the at least one pedestal form a cavity. The package also comprises a die positioned in the cavity and on the platform, with the die having an active circuit facing away from the platform. The package also comprises a conductive layer coupled to the die and to a conductive terminal. The conductive terminal is positioned above the at least one pedestal, and the die and the conductive terminal are positioned in different horizontal planes

BRIEF DESCRIPTION OF THE DRAWINGS

For a detailed description of various examples, reference will now be made to the accompanying drawings in which.

DETAILED DESCRIPTION

As die sizes continue to shrink, the aforementioned packaging techniques become increasingly problematic. For example, a small die size makes it difficult to mount an adequate number of conductive terminals (e.g., "pins" or solder balls) to the die. A small die size, in tandem with a reduced number of conductive terminals, increases power and current densities, causing higher temperatures and degradation due to electromigration. This situation results in a pair of competing interests. On one hand, it would be beneficial to increase the die size so that a greater number of conductive terminals can be accommodated and the aforementioned power and current density and electromigration problems can be mitigated. On the other hand, industry continues to demand smaller die sizes, but these smaller die sizes present the density and electromigration challenges described above. Traditional fan-out solutions are inadequate, as they still result in an undesirably large form factor due to a continued reliance on conductive terminals (or pins) for both electrical communication with and thermal dissipation from the die.

This disclosure describes examples of a package architecture in which the electrical communication and thermal dissipation paths of the package are separated from each other. In some examples, a package die is positioned on a platform that is conductive and relatively thick, thus making the platform well-suited for the dissipation of heat away from the die. In some examples, the package die is coupled to a conductive layer that provides signals between the die and one or more conductive terminals that are positioned in a higher horizontal plane than and in a fan-out configuration with respect to the die. Thus, the die communicates with other electrical devices to which the conductive terminals are coupled via the conductive layer. In sum, the conductive layer handles communications, while the platform handles heat dissipation. By separating the electrical communication and heat dissipation paths in this way, the aforementioned competing interests in shrinking die size and in having sufficient pin size and number to adequately dissipate heat are mitigated.

Figure 1:
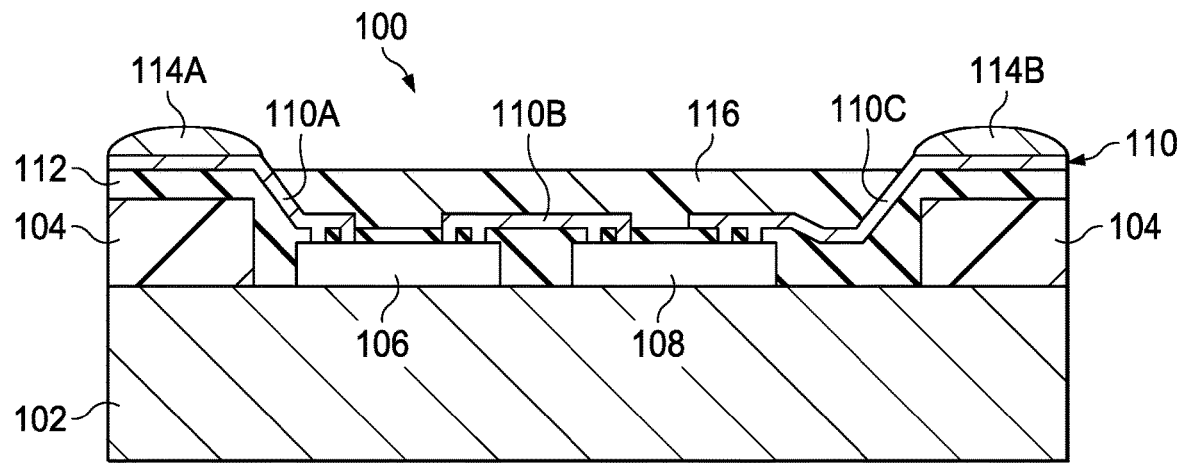
FIG. 1 depicts a cross-sectional view of an example package with separate communication and heat dissipation paths, in accordance with various examples.

FIG. 1 depicts a cross-sectional view of an example package 100 with separate communication and heat dissipation paths, in accordance with various examples. In particular, the package 100 includes a platform 102 and one or more pedestals 104 coupled to the platform 102. In some examples, the platform 102 comprises a conductive material, such as copper, another metal, or a metal alloy. In some examples, the platform 102 has a thickness ranging from 100 microns to 1.5 millimeters. Such a range of thicknesses may be useful at least because of the broad range of thermal dissipation requirements of various applications. In some examples, the platform 102 comprises a non-conductive material, such as plastic, a mold compound, or another suitable, non-conductive material.

In some examples, the one or more pedestals 104 comprise a conductive material, such as copper, another metal, or a metal alloy. In some examples, the one or more pedestals 104 comprises a non-conductive material, such as plastic, a mold compound, or another suitable, non-conductive material. In some examples, the one or more pedestals 104 are formed along some or all of a perimeter of the platform 102. For instance, in some such examples, the one or more pedestals 104 are formed along one edge of the platform 102. In some such examples, the one or more pedestals 104 are formed along multiple edges of the platform 102. In some examples, the one or more pedestals 104 have a thickness ranging from 100 microns to 500 microns. Such a range of thicknesses may be useful at least to accommodate the contents of the package, including the die thicknesses, the insulative and conductive layer thicknesses, etc.

In some examples, the one or more pedestals 104 and the platform 102 are a single, monolithic structure. In some examples, the one or more pedestals 104 are formed separately from the platform 102 and are coupled to the platform 102 (e.g., using any suitable attach material, such as solder). In any case, the platform 102 and the one or more pedestals 104 together form a cavity, as shown.

Still referring to FIG. 1, dies 106, 108 are coupled to the platform 102 in the aforementioned cavity. The dies 106, 108 include circuitry (not expressly shown) on the surfaces of the dies 106, 108 opposite the platform 102. Stated another way, the dies 106, 108 include circuitry on the top surfaces of the dies 106, 108. A conductive layer 110 couples this circuitry to conductive terminals 114A, 114B. For example, the conductive layer 110 comprises a first portion 110A that couples circuitry on the top surface of the die 106 to the conductive terminal 114A. Similarly, the conductive layer 110 comprises a second portion 110B that couples circuitry on the top surface of the die 106 to circuitry on the top surface of the die 108. Likewise, the conductive layer 110 comprises a third portion 110C that couples circuitry on the top surface of the die 108 to the conductive terminal 114B. In some examples, the conductive layer 110 comprises any suitable conductive metal, such as copper, another metal, or a metal alloy. In some examples, the conductive layer 110 has a thickness ranging from 5 microns to 50 microns, which may be beneficial at least to provide an adequate current carrying capability.

The package 100 further comprises an insulative layer 112. In examples, the insulative layer 112 abuts the platform 102, the dies 106, 108, the conductive layer 110, and the pedestals 104, as shown. In some examples, the insulative layer 112 comprises polyimide, although the scope of this disclosure is not limited as such. In some examples, the thickness of the insulative layer 112 ranges from 2 microns to 20 microns, which may be beneficial at least to provide reliable, continuous insulation and to provide a desirable surface topology. As depicted in FIG. 1, in some examples, the insulative layer 112 follows the contours of the conductive layer 110.

The package 100 further comprises conductive terminals 114A, 114B abutting the portions 110A, 110C of the conductive layer 110, respectively. The conductive terminals 114A, 114B may be any suitable electrically conductive material, such as solder. In some examples, nickel palladium gold may be used to finish the portions 110A, 110C of the conductive layer 110.

As depicted in FIG. 1, in some examples, the conductive terminals 114A, 114B are positioned in a different (e.g., higher) horizontal plane than the dies 106, 108. Accordingly, the conductive layer 110 has a concave shape so that it may couple to the dies 106, 108 as well as the conductive terminals 114A, 114B. This concave shape forms a second cavity that is filled by a protectant 116 that protects the contents of the package 100 from external influences. For example, such a protectant 116 may include a mold compound. In some examples, the top surface of the protectant 116 is co-planar with the sections of the conductive layer 110 positioned beneath the conductive terminals 114A, 114B.

The package 100 is not limited to the specific features shown in FIG. 1. For example, the thicknesses of the various layers of the package 100 may vary, as described above. For example, fewer or more than two dies may be housed in the package 100. For example, various components may have different shapes and sizes (e.g., the pedestals 104 may have rounded inner edges). In some examples, different combinations of materials may be used to manufacture the package 100. In some examples, various numbers of conductive terminals may be used. In some examples, different numbers of pedestals may be used. At least some examples of such variations will be described further below.

Still referring to FIG. 1, in operation, heat generated by the dies 106, 108 is transferred out of the package 100 via the platform 102, and electrical communications are provided between the dies 106, 108 and an electronic device (e.g., a printed circuit board) coupled to the conductive terminals 114A, 114B via the conductive layer 110. Thus, the package 100 does not rely on the conductive layer 110 to dissipate heat (although the conductive layer 110 may, in practice, dissipate a small degree of heat), and the package 100 does not rely on the platform 102 to carry electrical communications. By separating the heat dissipation and electrical communication paths of the package 100, the problems mentioned above are mitigated.

Figure 2:
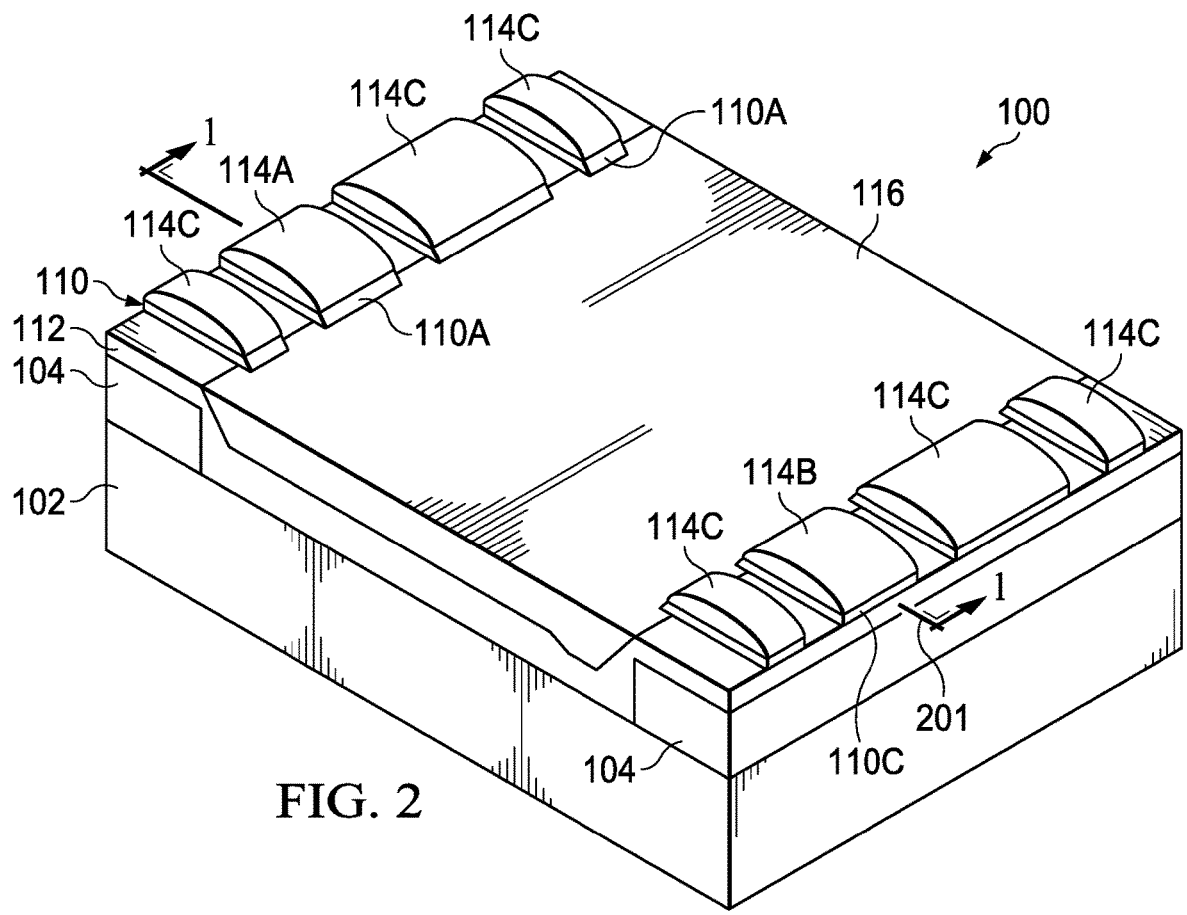
FIG. 2 depicts a perspective view of an example package with separate communication and heat dissipation paths, in accordance with various examples.

FIG. 2 depicts a perspective view of the example package 100. The cross-sectional view of FIG. 1 is taken along the line 201 shown in FIG. 2. As shown in FIG. 2, any number of conductive terminals may be used. The conductive terminals 114A, 114B of FIG. 1 are depicted in FIG. 2, but a plurality of additional conductive terminals 114C also are depicted. In some examples, the one or more pedestals 104 is positioned along the perimeter of the platform 102, and thus additional conductive terminals 114C are also positioned along the perimeter of the platform 102, above the one or more pedestals 104 of the package 100.

Figure 3A:
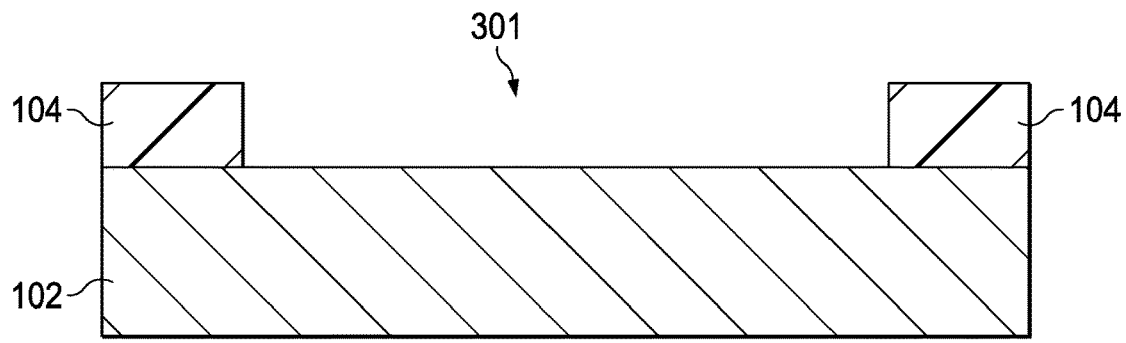
FIGS. 3A-3C, 4A-4D, 5A-5B, 6A-6C, and 7A-7C depict example steps for manufacturing packages with separate communication and heat dissipation paths, in accordance with various examples.

FIGS. 3A-3C, 4A-4D, 5A-5B, 6A-6B, and 7A-7C depict example steps for manufacturing packages with separate communication and heat dissipation paths, in accordance with various examples. FIG. 3A depicts a cross-sectional view of the platform 102 coupled to one or more pedestals 104. As explained above, the platform 102 and the one or more pedestals 104 may be a single, monolithic unit, or they may be manufactured separately and subsequently coupled together using any suitable adhesive (e.g., solder). In the current example, multiple pedestals 104 are used, and these pedestals 104 are formed separately from, and subsequently coupled to, the platform 102. The platform 102 and the pedestals 104 form a cavity 301.

Figure 3B:
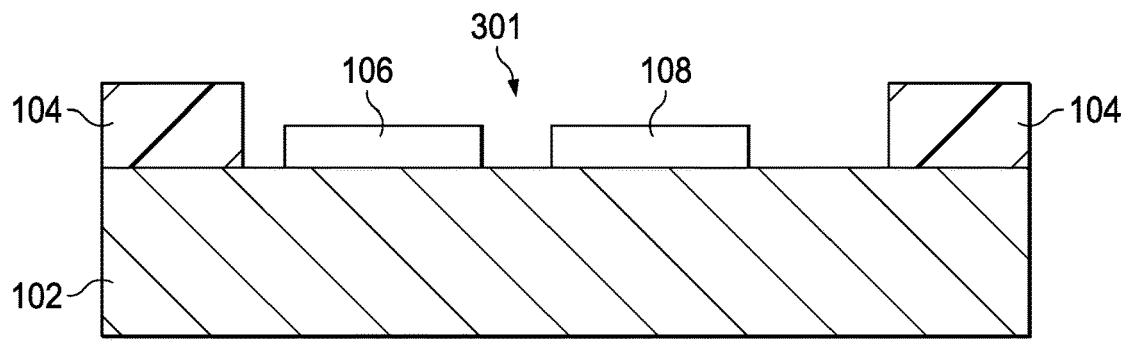

FIG. 3B depicts a cross-sectional view of the platform 102, the pedestals 104, and a pair of dies 106, 108 positioned on the platform 102. As explained above, the active circuitry (not expressly shown) of the dies 106, 108 is formed on the top surfaces of the dies 106, 108, that is, the surfaces of the dies 106, 108 facing away from the platform 102. Furthermore, although two dies 106, 108 are shown, in other examples, a single die or more than two dies may be used. It is not necessary to center the dies 106, 108 in the cavity 301, as shown, although the dies 106, 108 may be centered if desired.

Figure 3C:
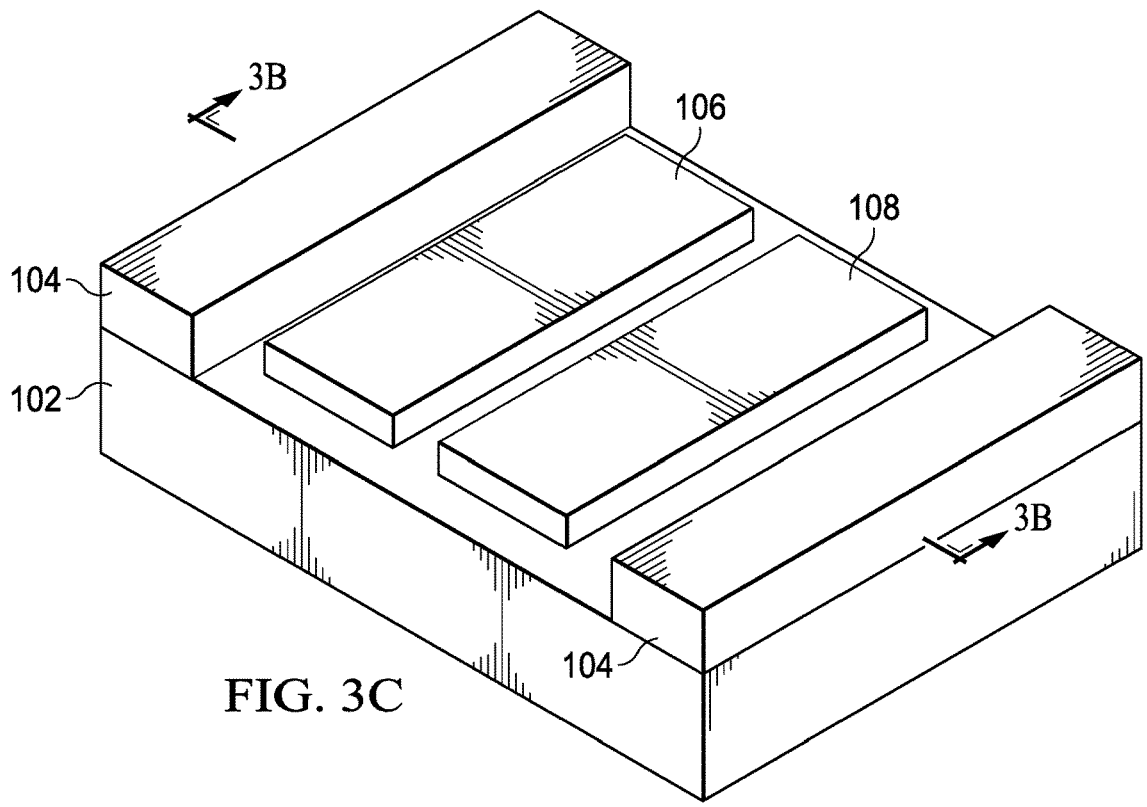

FIG. 3C depicts a perspective view of the platform 102, the pedestals 104, and the dies 106, 108. Although the dies 106, 108 are depicted as being elongated, in some examples, substantially square dies may be used. In examples with two or more dies, the multiple dies may be positioned in any suitable configuration on the platform 102.

Figure 4A:
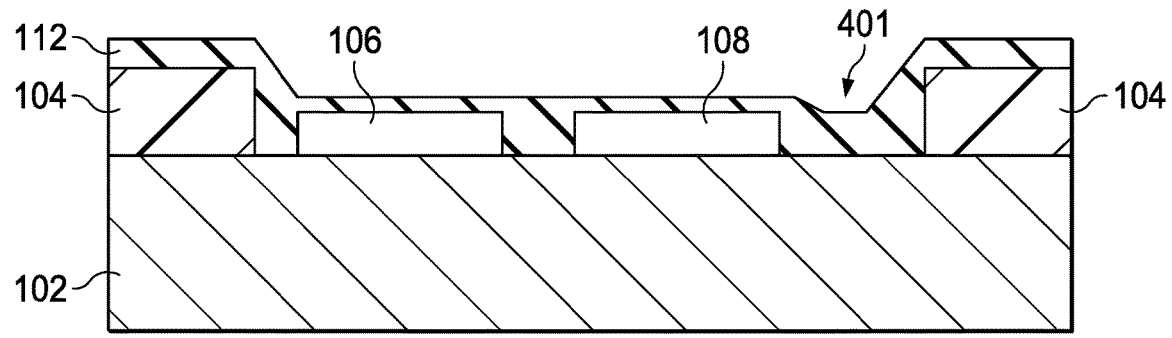

FIG. 4A depicts a cross-sectional view of the platform 102 coupled to the one or more pedestals 104 and the dies 106, 108. FIG. 4A additionally shows an insulative layer 112 deposited abutting the platform 102, one or more pedestals 104, and the dies 106, 108, as shown. As explained above, the insulative layer 112, in some examples, is a polyimide.

Figure 4B:
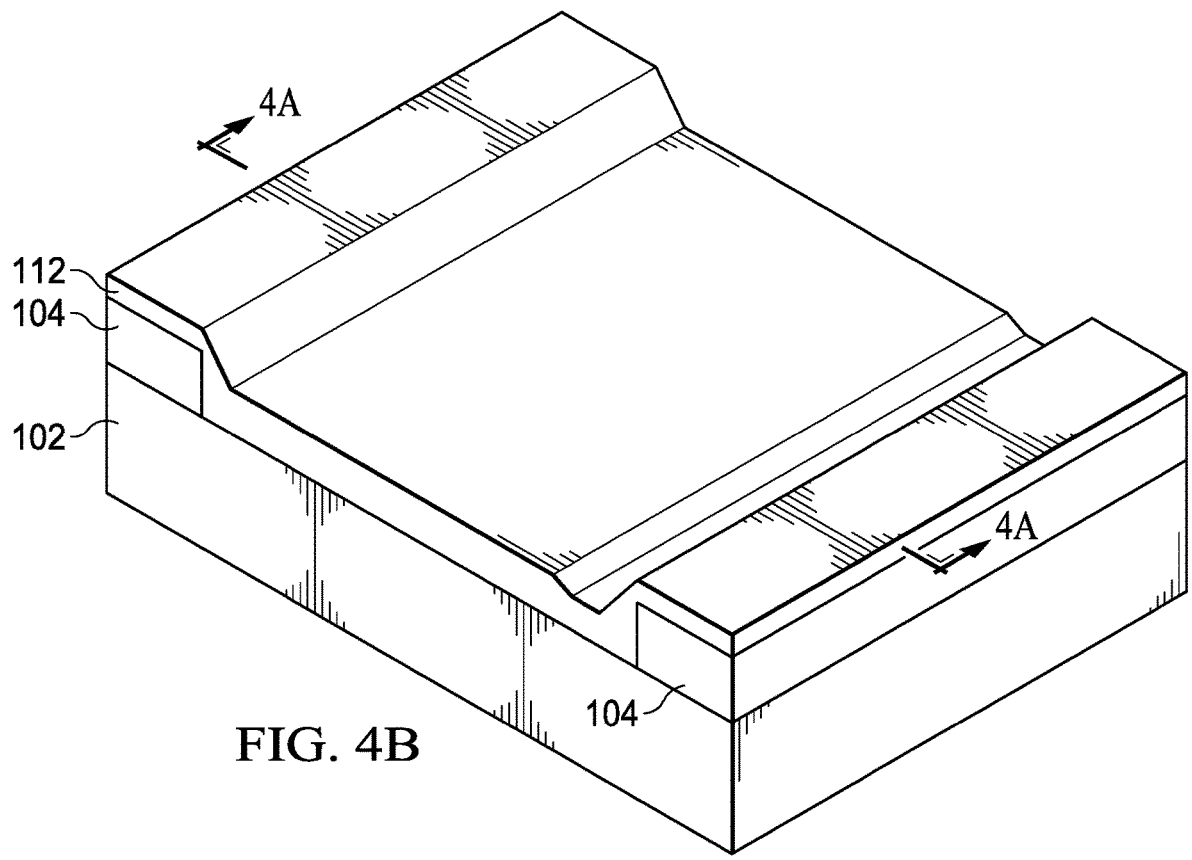

In other examples, the insulative layer 112 includes a mold compound, a resin, benzocyclobutene (BCB), polybenzoxazole (PCB), or any other suitable insulative material. In various examples the mold compound includes an epoxy. The specific shape of the insulative layer 112, in some examples, is as shown in FIG. 4A, but in other examples, any of a variety of other shapes may be used. The dip 401 is present as a by-product of the spacing between the die 108 and the pedestal 104 (or portion of the pedestal 104) to the right of the dip 401, in comparison to the degree of spacing between the die 106 and the pedestal 104 (or portion of the pedestal 104) to the left of the die 106. Regardless of the specific shape of the insulative layer 112, the insulative layer 112 may be formed using a photolithography process, including the use of appropriate masks. FIG. 4B depicts a perspective view of the structure shown in FIG. 4A.

Figure 4C:
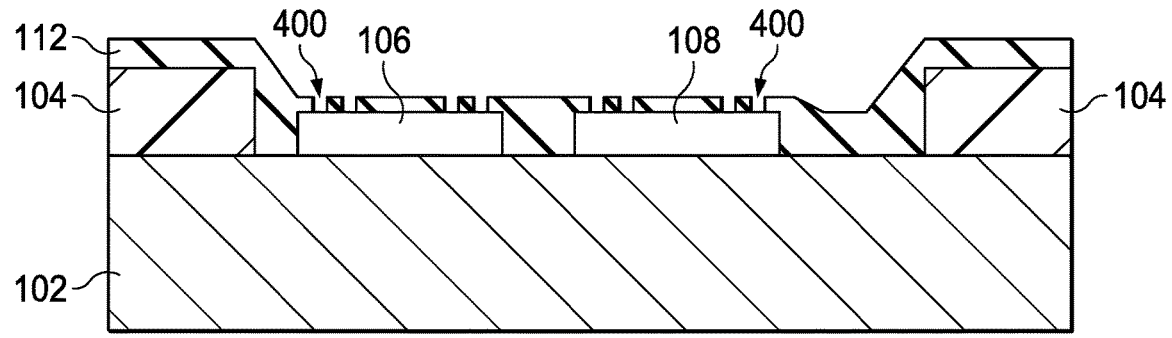
Figure 4D:
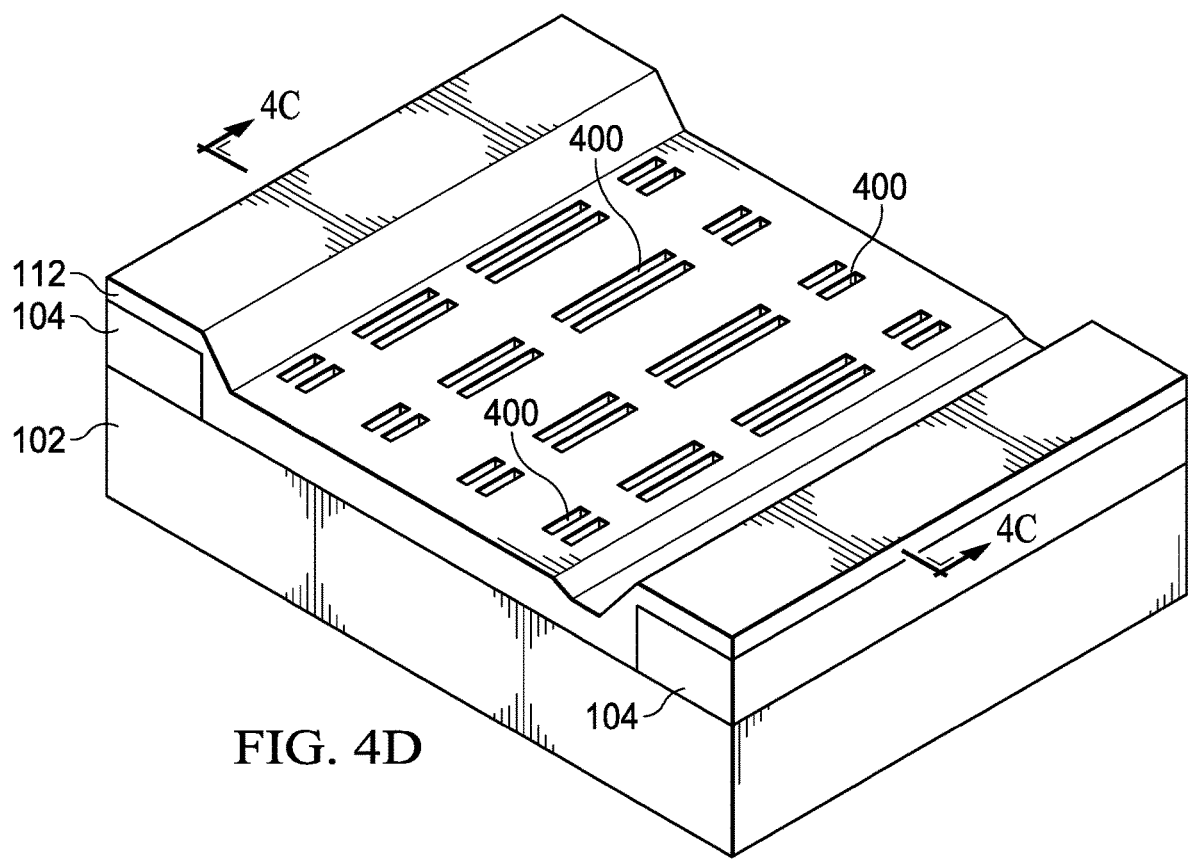

A photolithography process also may be used to form one or more vias 400 in the insulative layer 112, as FIG. 4C depicts. As explained below, a conductive layer that is formed may access circuitry on the dies 106, 108 using the vias 400. Thus, in at least some examples, the vias 400 are formed in such a manner that electrical connections may be formed with relevant contact points on the circuitry of the dies 106, 108. Any suitable number of vias may be formed, and any suitable dimensions may be used when forming the vias. FIG. 4D depicts a perspective view of the structure of FIG. 4C.

Figure 5A:
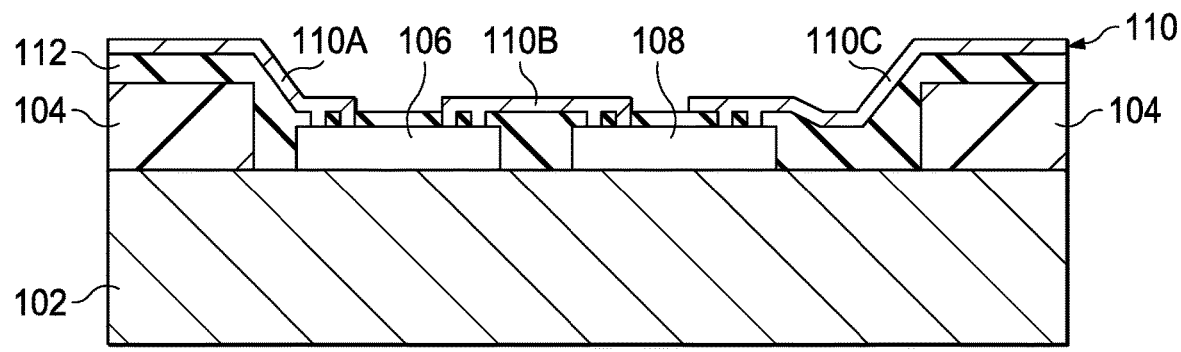
Figure 5B:
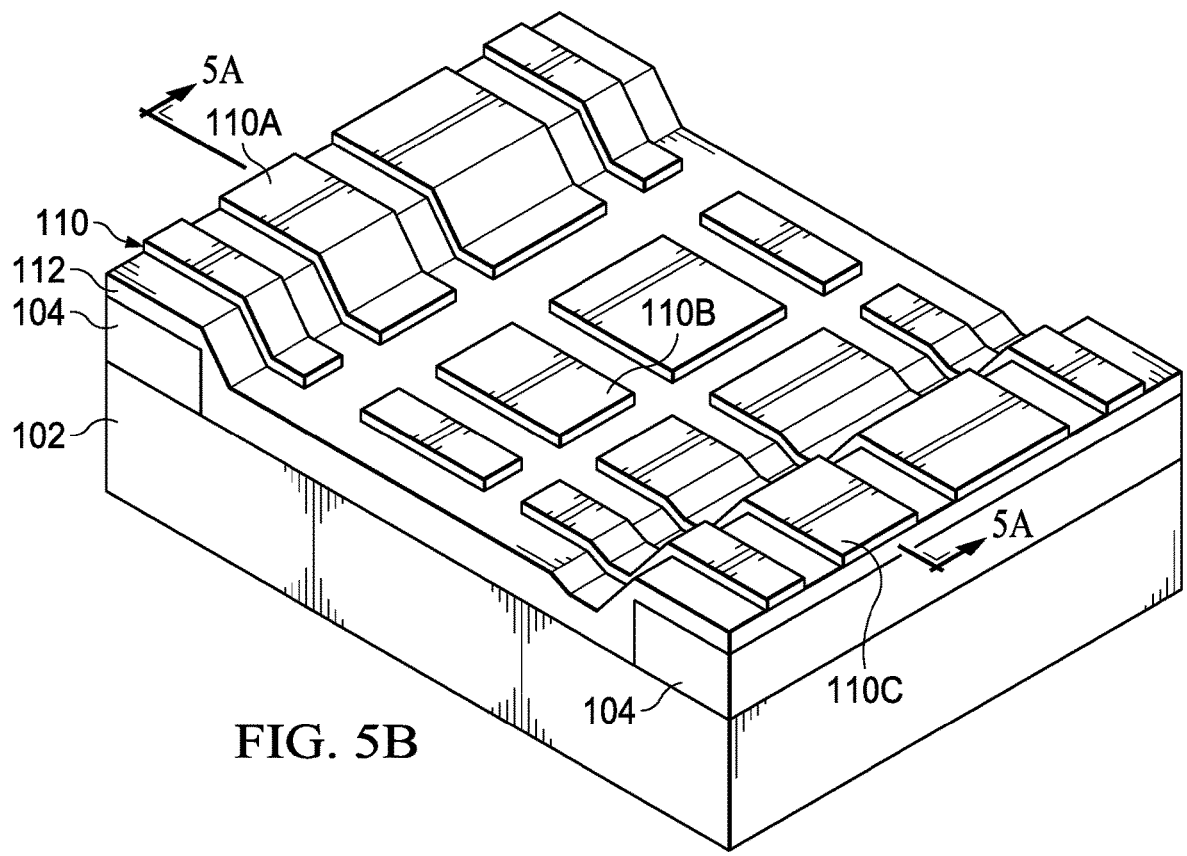

FIG. 5A depicts a cross-sectional view of the platform 102, the one or more pedestals 104, the dies 106, 108, and the insulative layer 112. In addition, FIG. 5A depicts portions 110A, 110B, and 110C of the conductive layer 110. In some examples, the conductive layer 110 has a thickness of 3 microns to 70 microns. In some examples, the conductive layer 110 is formed of copper. In some examples, the conductive layer 110 is formed using a plating process. For instance, a seed layer (e.g., titanium, titanium-tungsten, titanium-tungsten/copper) may be deposited using a sputtering technique, and a photoresist may then be applied and selectively photo-imaged to selectively plate the portions 110A, 110B, and 110C of the conductive layer 110 as shown. Alternate configurations of the conductive layer 110 are contemplated and included within the scope of this disclosure, and such alternative configurations may readily be formed using appropriate seeding and plating techniques. FIG. 5B depicts a perspective view of the structure of FIG. 5A. As shown, multiple additional portions of the conductive layer 110 may be formed to couple to various portions of circuitry on the dies 106, 108.

Figure 6A:
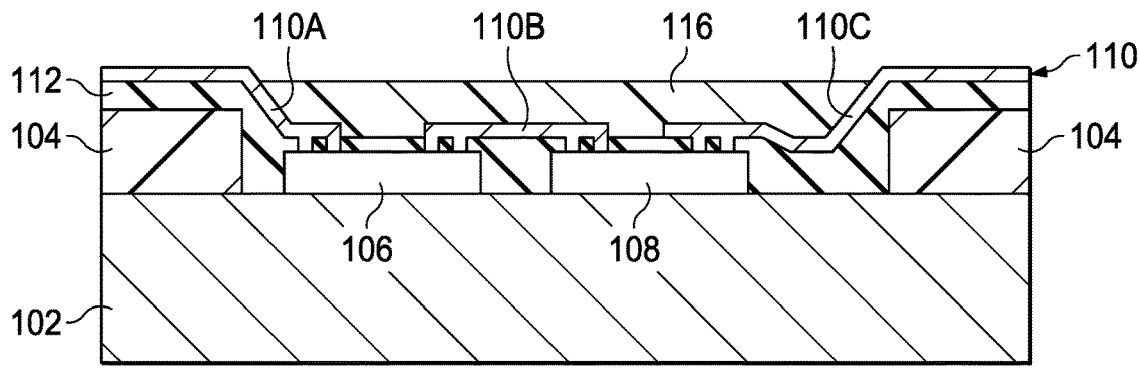
Figure 6B:
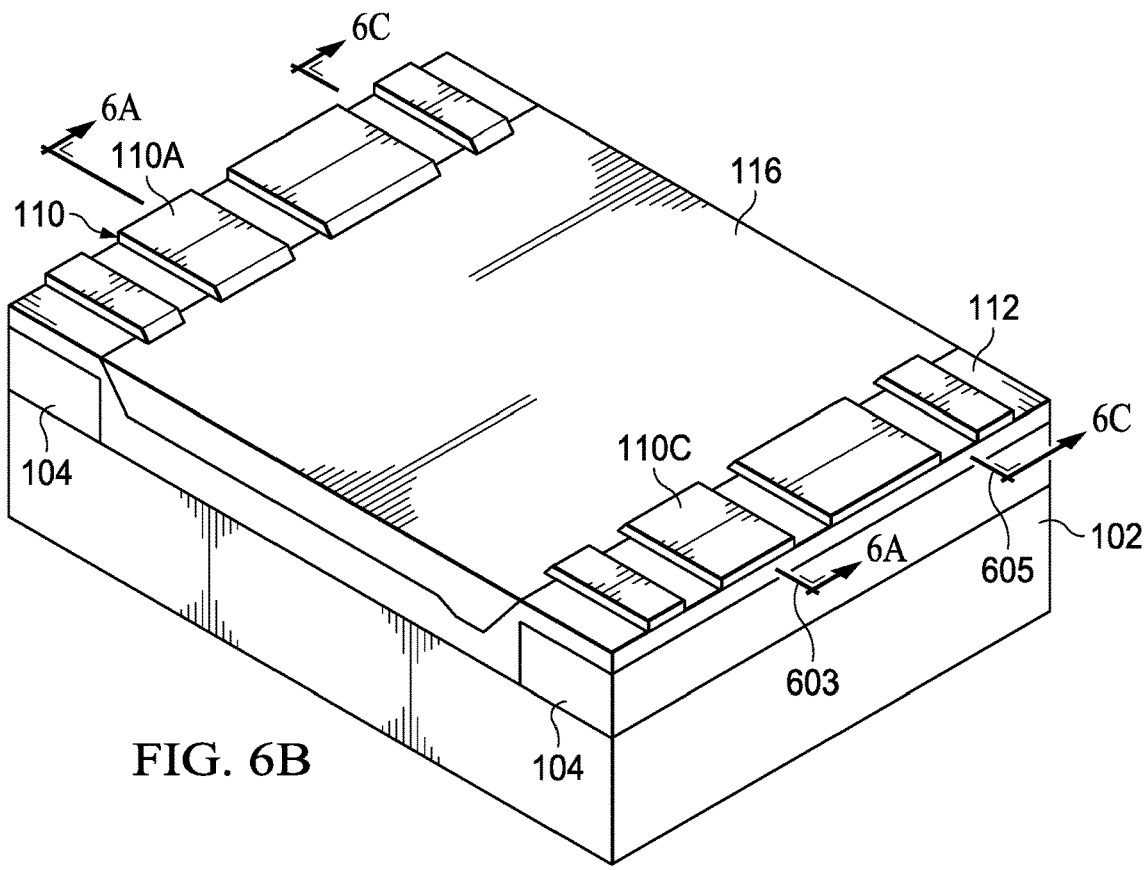
Figure 6C:
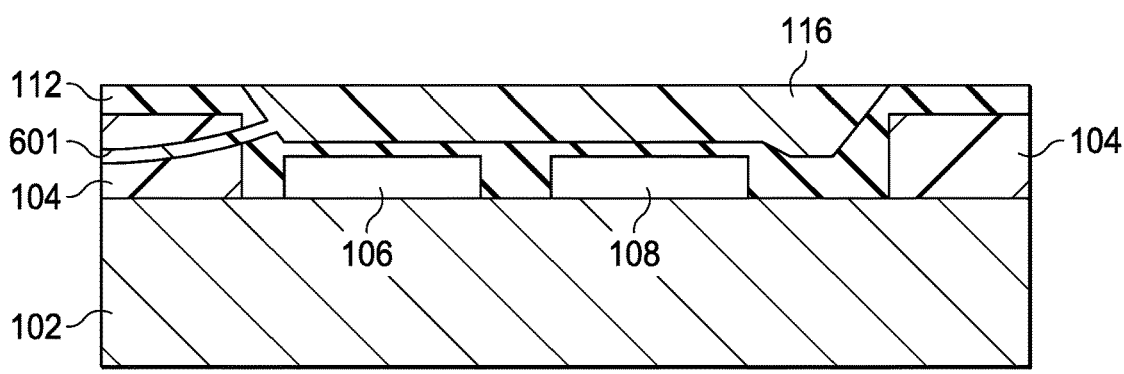

FIG. 6A depicts a cross-sectional view of the structure of FIG. 5A, but with the addition of a protectant 116 deposited as shown. In some examples, the protectant 116 is a non-conductive polymer, a mold compound, or a resin. In some examples, a high coefficient of thermal expansion (CTE) mold compound is used to reduce the CTE mismatch with the printed circuit board to which the package 100 may be mounted, and to enhance board-level reliability (BLR). The protectant 116, in some examples, is deposited using a film-assisted molding process, although other techniques are contemplated. In some examples, a channel may be formed through the one or more pedestals 104, the insulative layer 112, and into the cavity in which the protectant 116 is positioned in FIG. 6A, and this channel may be used to inject the protectant 116 into this cavity. In some examples, the channel does not pass through the conductive layer 110 and instead passes in between portions of the conductive layer 110. In some examples, after the protectant 116 has been injected using the channel, the channel is filled and sealed using the protectant 116. Multiple such channels may be used. FIG. 6C depicts one such channel 601 through which the protectant 116 may be injected. The cross-sectional view of FIG. 6C is taken along line 605 (FIG. 6B), while the cross-sectional view of FIG. 6A is taken along line 603 (FIG. 6B).

Figure 7A:
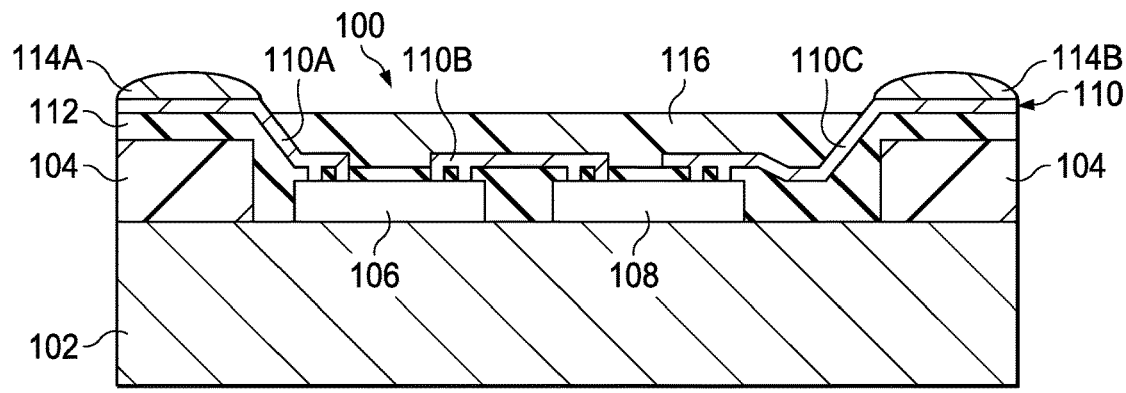

FIG. 7A depicts a cross-sectional view of the structure of FIG. 6A, but with the addition of conductive terminals 114A, 114B, as shown. The conductive terminals 114A, 114B comprise any suitable conductive material, for example, nickel palladium, nickel palladium gold, immersion gold, tin, solder, etc. Because the conductive terminals 114A, 114B are distanced from the dies 106, 108, any mechanical forces applied to the conductive terminals 114A, 114B will not be transferred to the dies 106, 108 (or will be transferred only minimally). In addition, the fan-out configuration of the conductive terminals 114A, 114B relative to the dies 106, 108 enables the conductive terminals 114A, 114B to be larger and greater in number than they would be if they were located more proximate to the dies 106, 108. As a result, current flowing through the conductive layer 110 is spread out as it approaches the conductive terminals 114A, 114B, thus reducing current density, improving electromigration, and improving thermal dissipation. Thus, some or all of the disadvantages described above are mitigated.

Figure 7B:
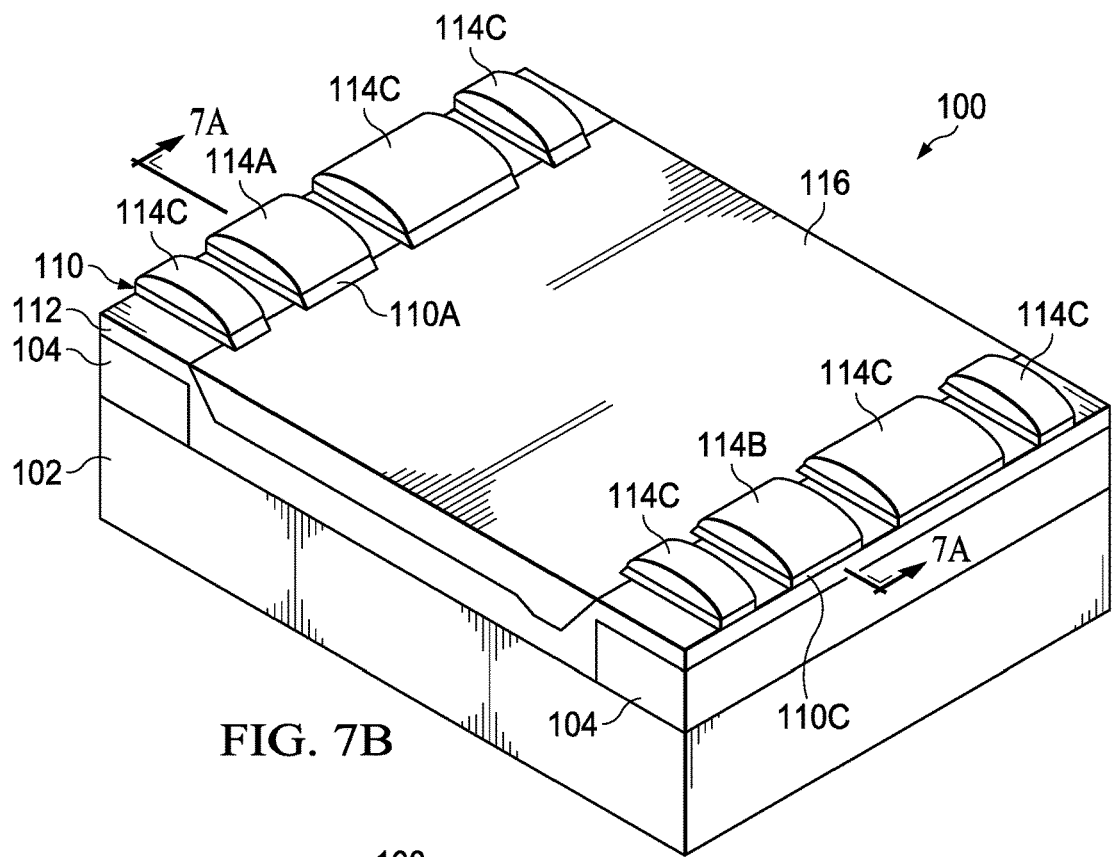
Figure 7C:
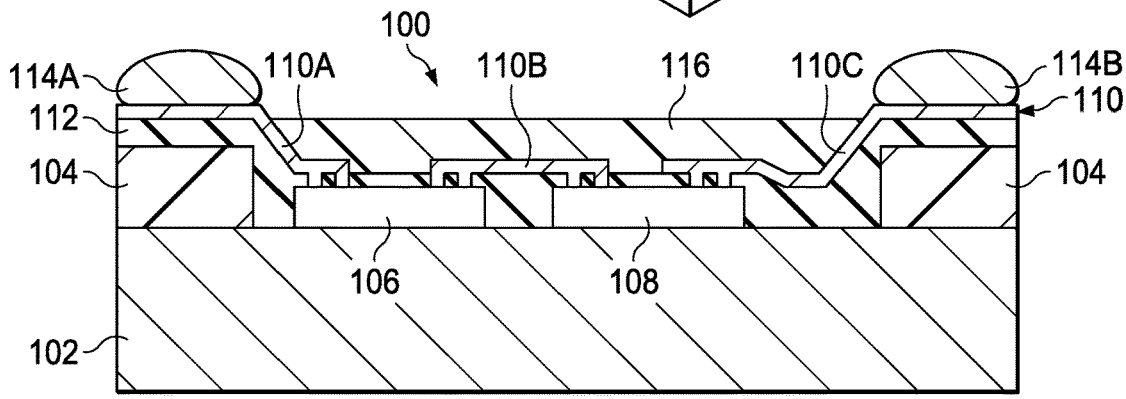

FIG. 7B depicts a perspective view of the structure of FIG. 7A. In this view, the conductive terminals 114A, 114B are shown in addition to numerous additional conductive terminals 114C, each of which may couple to a variety of contact points on the circuitry formed on the dies 106, 108. FIG. 7C depicts an alternative shape for the conductive terminals 114A, 114B, which, in this example, may comprise solder balls.

Figure 8:
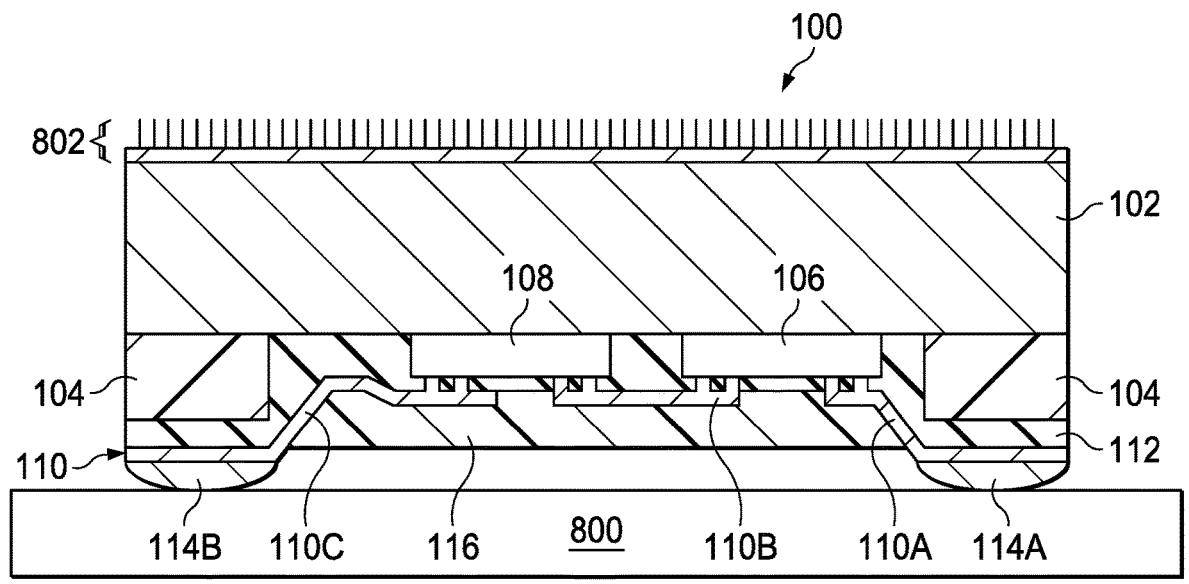
FIG. 8 depicts an example package, with separate communication and heat dissipation paths, mounted to another electronic device, in accordance with various examples.

FIG. 8 depicts the example package 100 mounted to another electronic device 800, in accordance with various examples. Although the package 100 may be mounted to any of a variety of suitable electronic devices with which the dies 106, 108 may communicate, in some examples, the electronic device 800 comprises a printed circuit board (PCB). During operation, the dies 106, 108 emit heat, which is dissipated by the platform 102, and the dies 106, 108 communicate with the electronic device 800 via the conductive terminals 114A, 114B. In this way, the heat dissipation and electrical communication paths are separated from each other, and the above-described advantages are realized. In some examples, a heat sink 802 may be coupled to the top of the platform 102 to further enhance heat dissipation. Although a heat sink is shown only in FIG. 8, a heat sink may be coupled to a conductive or partially-conductive platform in any of the examples described in this disclosure.

Figure 9A:
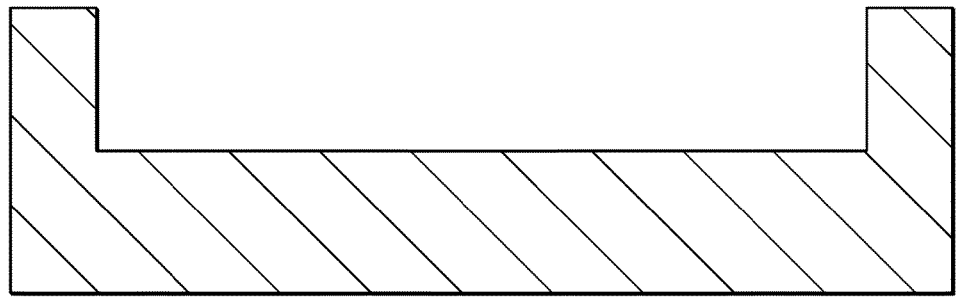
FIGS. 9A-9I depict examples of platforms and pedestals that are usable in various packages with separate communication and heat dissipation paths, in accordance with various examples.
Figure 9B:
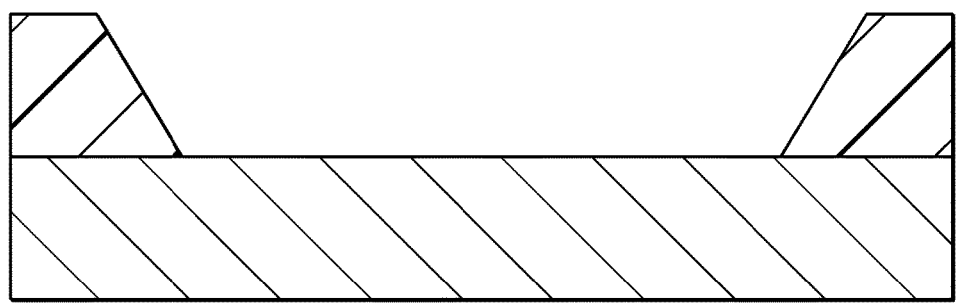
Figure 9C:
Figure 9D:
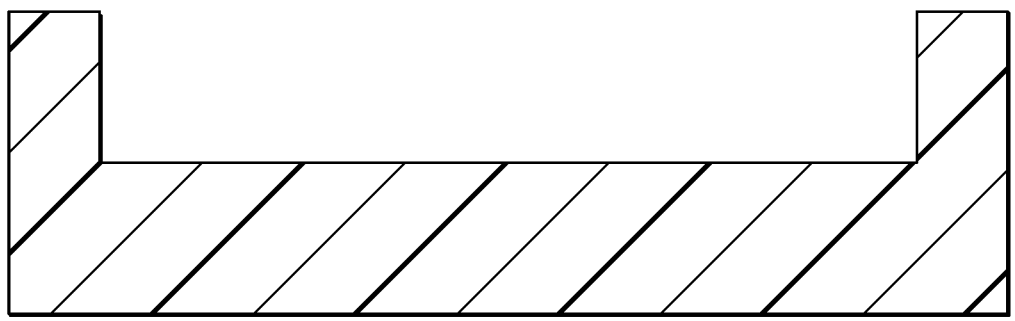

FIGS. 9A-9I depict alternative platforms and pedestals that are usable in various packages with separate communication and heat dissipation paths, in accordance with various examples. Specifically, FIG. 9A depicts a platform and one or more pedestals that are formed as a single, monolithic unit. This architecture is advantageous for heat dissipation. In examples, the platform and one or more pedestals are composed of copper. FIG. 9B depicts a platform with one or more pedestals coupled thereto. The platform is formed of a conductive material, such as copper, and the one or more pedestals are formed of an insulative material, such as a mold compound. This architecture dissipates heat effectively while providing adequate insulation on the sides. The tapered edges of the one or more pedestals may facilitate easier plating. FIG. 9C depicts a platform composed of an insulative material coupled to one or more pedestals that are also composed of an insulative material. Using different materials for the platform and the one or more pedestals may be advantageous in that the different materials may serve different purposes—for example, reliability, thermal expansion, insulation quality, etc. FIG. 9D, in contrast, depicts a monolithic platform and pedestal combination composed of an insulative material.

Figure 9E:
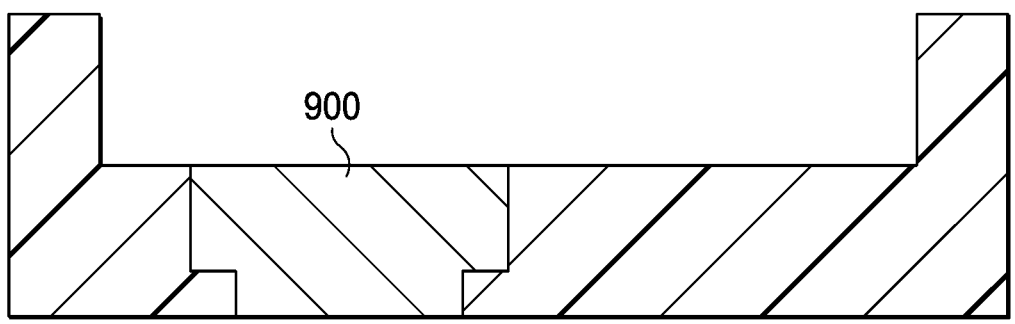

FIG. 9E depicts a platform having a portion 900 composed of a conductive material (e.g., copper), and the remainder composed of an insulative material. The shape of the conductive portion 900 is merely illustrative and does not limit the scope of this disclosure. In some examples, the structure depicted in FIG. 9E is formed by producing a conductive platform that is subsequently selectively coated with a mold compound or other insulative material in such a manner that only the portion 900 remains exposed. The structure of FIG. 9E may be advantageous in the event that it is desired to have different substrate voltages for different dies positioned on the platform. In addition, the structure of FIG. 9E may be advantageous in the event that one of the dies on the platform is a power die with high heat levels and another die on the platform is a control die. In such a case, the power die should be positioned on the conductive portion 900, while the control die (which primarily sends and receives data signals and has low heat radiation) may be positioned on an insulative portion of the platform.

Figure 9F:
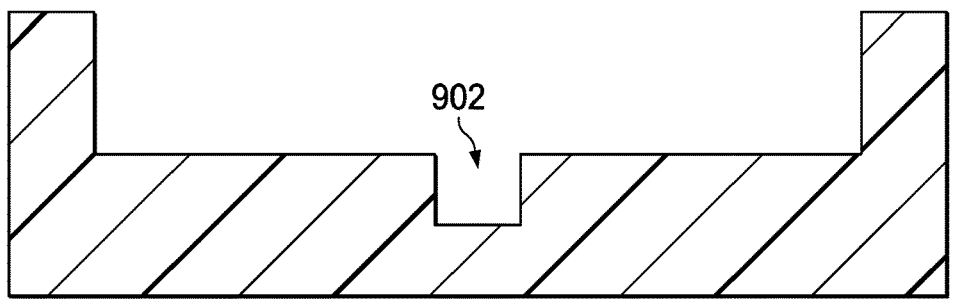

FIG. 9F depicts a platform having a trench 902 formed in the platform. The trench 902 increases the surface area of the platform between the dies that are positioned on either side of the trench 902, thereby enhancing isolation between the dies.

Figure 9G:
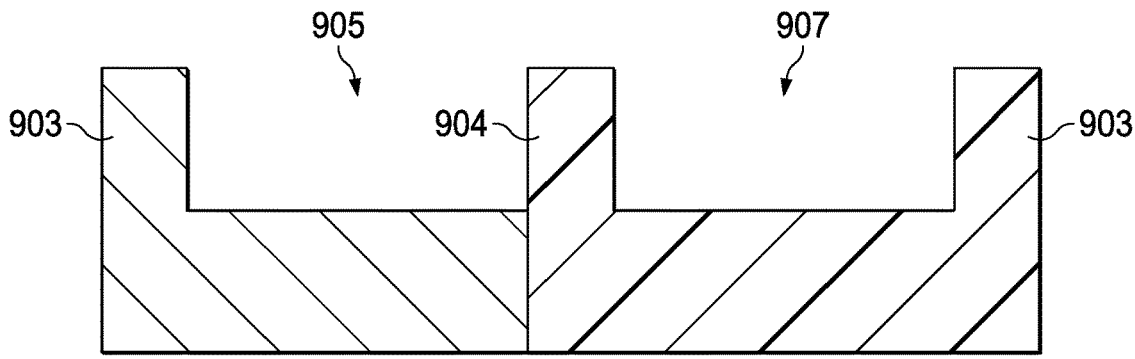

FIG. 9G depicts a multi-cavity structure having a platform, one or more pedestals 903, and an additional pedestal 904. The additional pedestal 904 results in the formation of two separate cavities 905 and 907. The additional pedestal 904 may be beneficial by providing space for additional conductive terminals. In addition, the portions of the platform and pedestals that form the cavities 905, 907 may be composed of different materials. For instance, the portions of the platform and the pedestals that form the cavity 905 may be composed of a conductive material, such as copper, while the portions of the platform and the pedestals that form the cavity 907 may be composed of an insulative material, such as a mold compound. The pedestal 904 may be composed of a conductive or an insulative material.

Figure 9H:
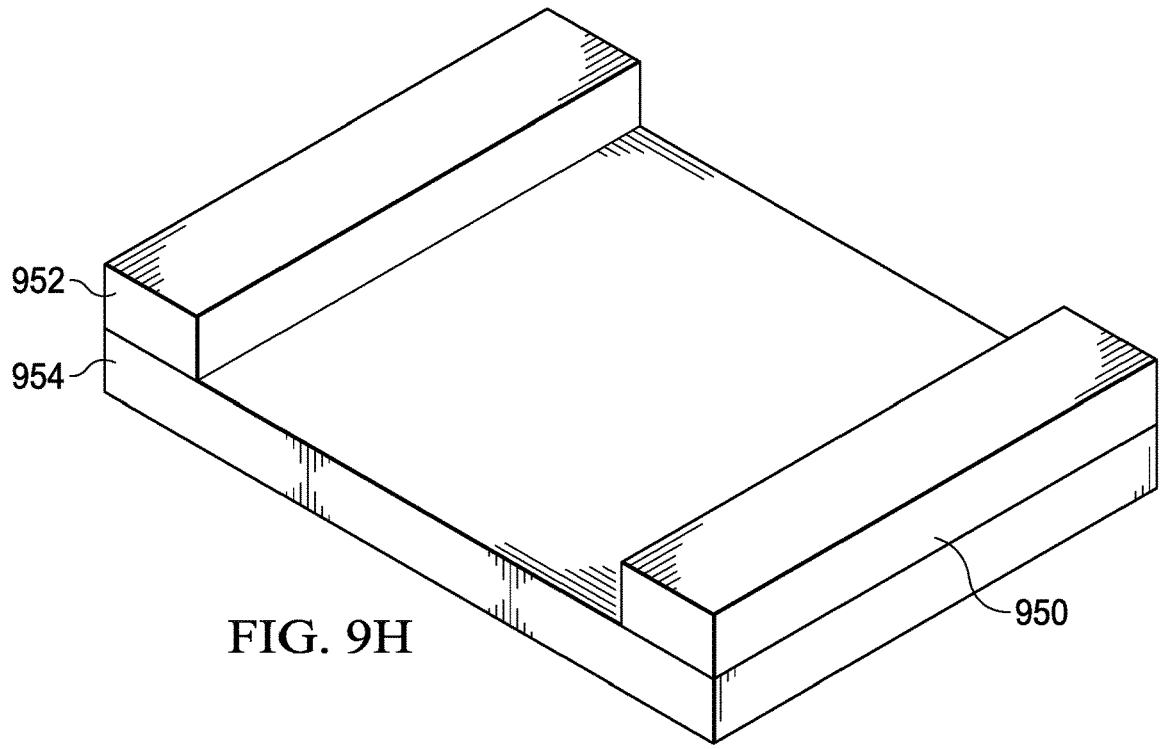
Figure 9I:
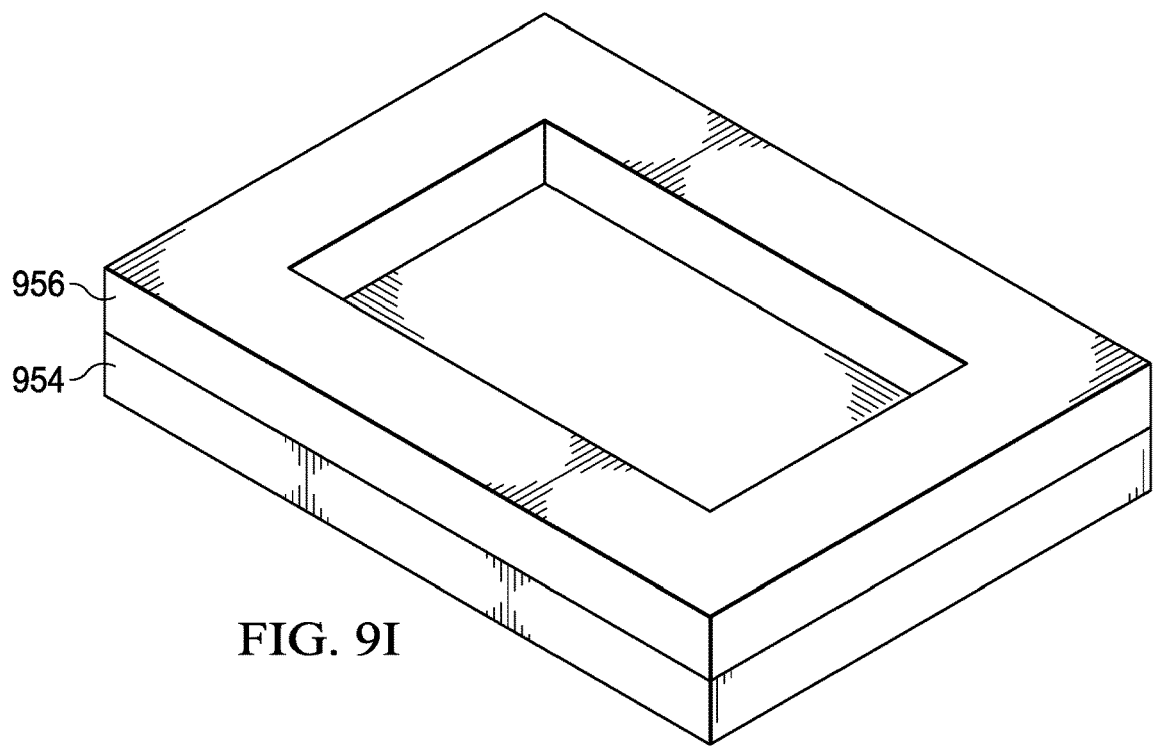

FIGS. 9H and 9I depict perspective views of platforms having different numbers of pedestals. In FIG. 9H, two separate pedestals 950, 952 are shown on opposing edges of a platform 954. In FIG. 9I, a single pedestal 956 is shown positioned along a perimeter of the platform 954. Were the additional pedestal 904 of FIG. 9G to be included in FIG. 9H or 9I that pedestal 904 would bisect the platform 954.

Figure 10A:
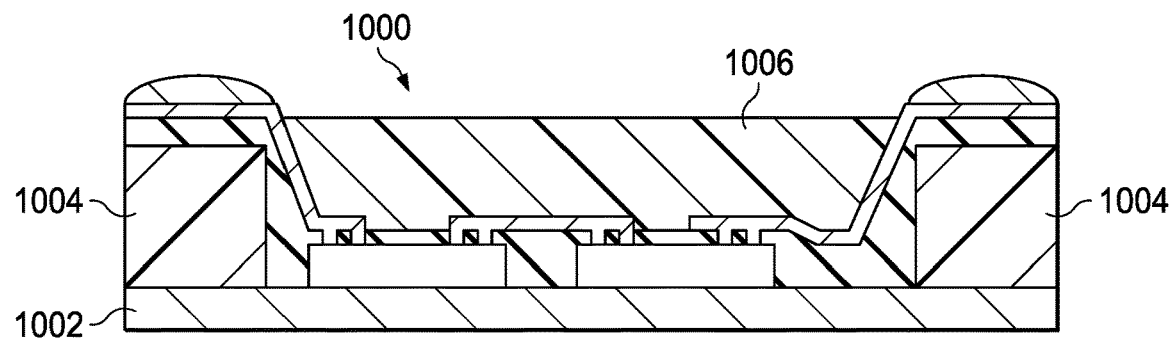
FIGS. 10A-10F depict cross-sectional views of additional examples of packages having separate communication and heat dissipation paths, in accordance with various examples.

FIGS. 10A-10F depict cross-sectional views of additional examples of packages having separate communication and heat dissipation paths, in accordance with various examples. FIG. 10A depicts a package 1000 having a platform 1002, one or more pedestals 1004, and a protectant 1006. In this example, the platform 1002 has a thickness ranging from 100 microns to 250 microns, and the protectant 1006 has a thickness ranging from 300 microns to 1000 microns. These thicknesses result in a package 1000 that is dominated by insulative materials (e.g., plastic), which provides improved CTE matching and reliability.

Figure 10B:
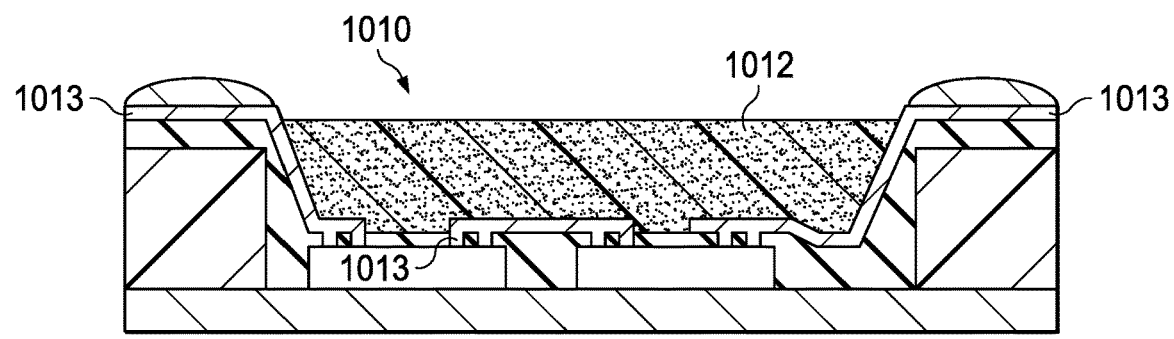

FIG. 10B depicts a package 1010 that is virtually identical to the package 1000, but in which the protectant 1012 comprises a thermally enhanced mold compound. This is advantageous because it facilitates the dissipation of any residual heat generated by current flow in the conductive layer 1013.

Figure 10C:
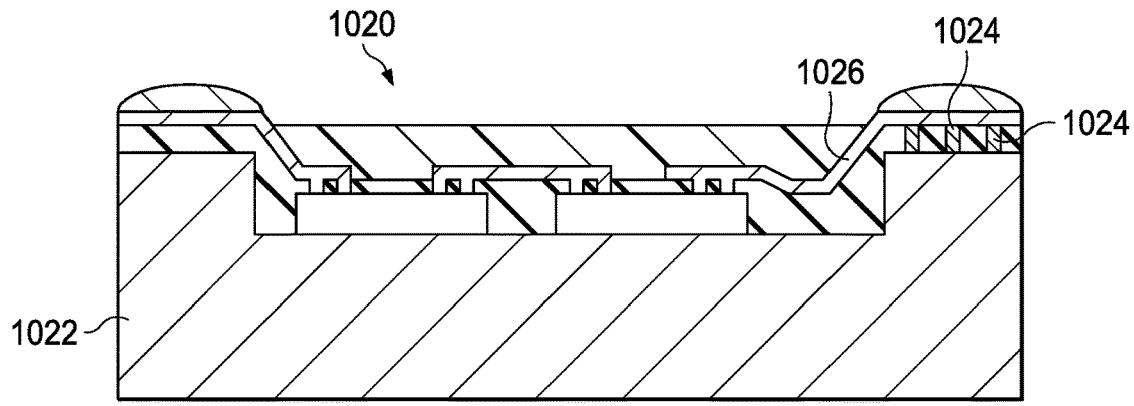

FIG. 10C depicts a package 1020 having a platform 1022 composed of a conductive material, such as copper. The platform 1022 has a thickness ranging from 500 microns to 2000 microns. In addition, conductive connections 1024 couple the conductive layer 1026 to the platform 1022, thereby enhancing heat dissipation away from the conductive layer 1026 and through the platform 1022. Because the package 1020 is a metal-dominated package, heat dissipation is substantially enhanced.

Figure 10D:
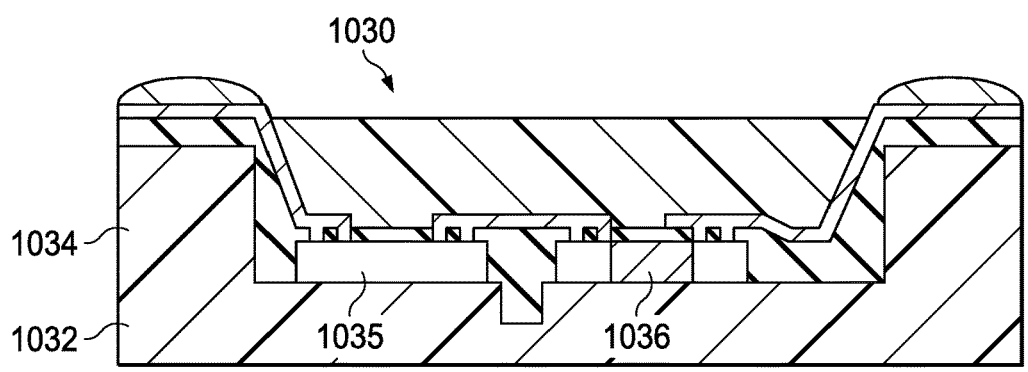

FIG. 10D depicts a package 1030 having a platform 1032 and one or more pedestals 1034. In this example, the platform 1032 and pedestals 1034 are insulative, but the scope of this disclosure is not limited as such. The package 1030 includes a die 1035 and a passive component 1036 (e.g., resistor, capacitor, inductor). Any other suitable electronic component may be substituted for the passive component 1036.

Figure 10E:
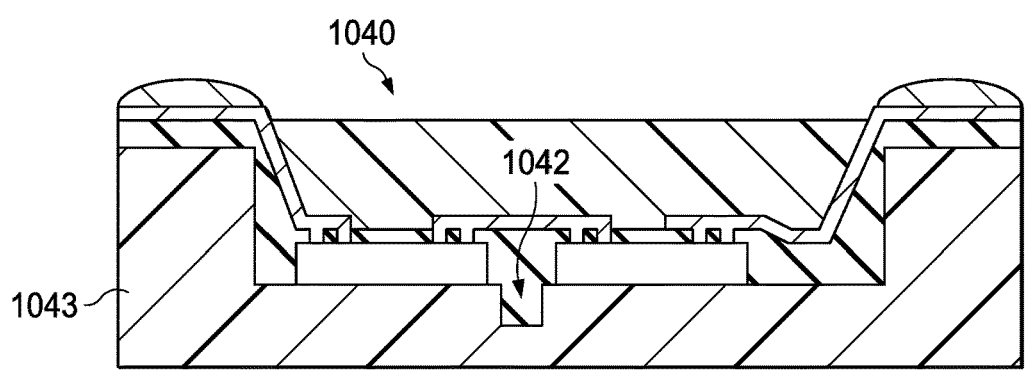

FIG. 10E depicts a package 1040 that includes a trench 1042 in the platform 1043. The dies positioned on either side of the trench 1042 have an increased surface area of the platform 1043 between them relative to the surface area that would be present were the trench 1042 omitted. This increased surface area (and, thus, distance along the surface of the platform 1043) improves isolation between the dies.

Figure 10F:
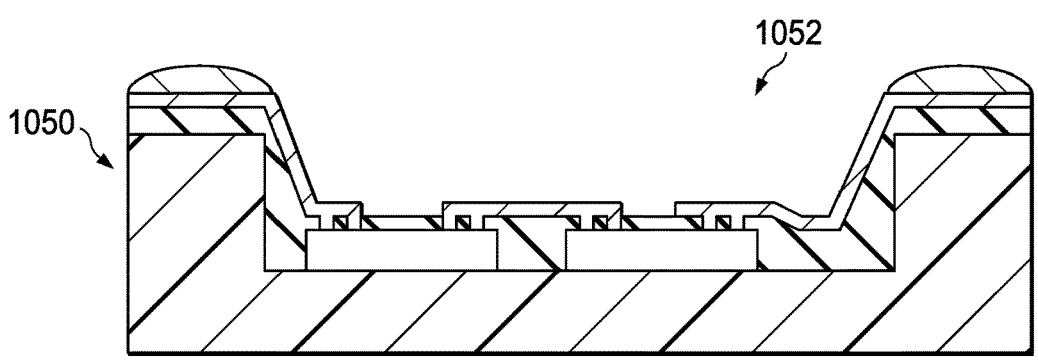

FIG. 10F depicts a package 1050 including a clear protectant 1052 (e.g., a clear mold compound) that permits light to pass therethrough. Such a clear protectant 1052 may be useful in applications involving optical signals that are transmitted from and received by one or more of the dies in the package 1050.

Numerous architectural variations are depicted throughout this disclosure, including in FIGS. 9A-9I and 10A-10F. Any and all such variations, whether expressly described herein or not, may be implemented in any or all examples of this disclosure, whether expressly described herein or not. Any and all such implementations are contemplated and included within the scope of this disclosure. Furthermore, any and all such variations may be implemented in any combination. Thus, as just one example, some or all of the features of FIG. 9B may be implemented in tandem with some or all of the features of FIG. 9E and FIG. 9F.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A package, comprising:
a platform;
at least one pedestal positioned along at least a portion of a perimeter of the platform, the platform and the at least one pedestal forming a cavity;
a die positioned in the cavity and on the platform, the die having an active circuit facing away from the platform;
a conductive layer coupled to the die and to a conductive terminal, the conductive terminal positioned above the at least one pedestal, the die and the conductive terminal positioned in different horizontal planes, wherein the conductive terminal includes solder;
an insulative layer isolating the at least one pedestal from the conductive layer; and
a mold compound including epoxy contacting a top surface of the conductive layer.

2. The package of claim 1, wherein the platform comprises a conductive platform configured to dissipate heat from the die.

3. The package of claim 2, wherein the conductive platform has a thickness ranging from 100 microns to 1.5 mm.

4. The package of claim 1, wherein the at least one pedestal is sloped.

5. The package of claim 1, wherein a first portion of the platform is conductive and a second portion of the platform is insulative.

6. The package of claim 1, wherein the platform includes a trench between the die and another die, the another die positioned on the platform.

7. The package of claim 1, further comprising another pedestal coupled to the platform and bisecting the platform into first and second portions, the die positioned on the first portion and another die positioned on the second portion.

8. The package of claim 7, wherein the first portion of the platform is conductive and the second portion of the platform is insulative.

9. The package of claim 1, wherein the insulative layer does not cover one side of the at least one pedestal.

10. The package of claim 1, wherein the insulative layer is positioned between the at least one pedestal and the conductive layer.

11. The package of claim 1, further comprising the mold compound positioned above at least a portion of the conductive layer.

12. The package of claim 11, wherein the mold compound is a clear mold compound suitable for allowing light to pass through the clear mold compound.

13. The package of claim 1, further comprising a passive component positioned in the cavity and on the platform, the passive component coupled to the conductive layer.

14. The package of claim 1, wherein the platform is formed from a different material than the at least one pedestal.

15. The package of claim 1, wherein the platform and the at least one pedestal are a monolithic unit.

16. A system, comprising:
a package, comprising:
a conductive platform;
at least one pedestal positioned along at least a portion of a perimeter of the conductive platform;
a die positioned on the conductive platform, the conductive platform to carry heat away from the die, the die having a circuit facing away from the conductive platform;
a conductive terminal positioned above the at least one pedestal and in a different horizontal plane than the die;
a conductive layer coupling the circuit to the conductive terminal;
an insulative layer contacting the die, a bottom surface of the conductive layer, the conductive platform, and the at least one pedestal;
a mold compound including epoxy contacting a top surface of the conductive layer; and
a heat sink coupled to a surface of the conductive platform opposite the die.

17. The system of claim 16, wherein the at least one pedestal is positioned along the entire perimeter of the conductive platform.

18. The system of claim 16, wherein the at least one pedestal is positioned along opposing edges of the conductive platform.

19. The system of claim 16, further comprising another pedestal bisecting the conductive platform.

20. The system of claim 16, wherein the conductive layer includes a material selected from the group consisting of nickel palladium, nickel palladium gold, immersion gold, and tin.

21. A package, comprising:
a die, the die having a circuit;
a plurality of conductive terminals including solder exposed to a surface of the package, the plurality of conductive terminals coupled to the die, the conductive terminals positioned in a different horizontal plane than the die;
a conductive platform coupled to the die, the conductive platform to dissipate heat from the die;
an insulative layer contacting a bottom surface of a conductive layer coupled to the die; and
a mold compound contacting the conductive layer; wherein the plurality of conductive terminals is on opposing external sides of the package.

22. The package of claim 21, wherein the conductive platform has a thickness ranging from 100 microns to 1.5 millimeters.

23. The package of claim 21, wherein the conductive layer is coupled to a first side of the die and the conductive platform coupled to a second side of the die opposite the first side of the die.

24. The package of claim 21, wherein the plurality of conductive terminals are positioned along a perimeter of the package.

25. The package of claim 21, wherein the plurality of conductive terminals bisects the package.

26. The package of claim 21, wherein the insulative layer is positioned abutting the die.

* * * * *